US007702111B2

(12) United States Patent
Gunnarsson

(10) Patent No.: US 7,702,111 B2
(45) Date of Patent: Apr. 20, 2010

(54) AUDIO STEREO PROCESSING METHOD, DEVICE AND SYSTEM

(75) Inventor: Fredrik Gunnarsson, Huddinge (SE)

(73) Assignee: Embracing Sound Experience AB, Stockholm (SE)

( * ) Notice: Subject to any disclaimer, the term of this patent is extended or adjusted under 35 U.S.C. 154(b) by 88 days.

(21) Appl. No.: 10/565,163

(22) PCT Filed: Jul. 16, 2004

(86) PCT No.: PCT/SE2004/001138

§ 371 (c)(1), (2), (4) Date: Jan. 19, 2006

(87) PCT Pub. No.: WO2005/009078

PCT Pub. Date: Jan. 27, 2005

(65) Prior Publication Data

US 2006/0188101 A1 Aug. 24, 2006

(30) Foreign Application Priority Data

Jul. 21, 2003 (SE) .................................... 0302110

(51) Int. Cl.
*H04R 5/00* (2006.01)
*H04R 1/40* (2006.01)
*H04R 5/02* (2006.01)
*H03G 5/00* (2006.01)

(52) U.S. Cl. ............................... 381/1; 381/97; 381/98; 381/17; 381/303

(58) Field of Classification Search ..................... 381/1, 381/97, 310, 17, 19, 61, 98, 303
See application file for complete search history.

(56) References Cited

U.S. PATENT DOCUMENTS 2,093,540 A 9/1937 Blumlein (Continued)

FOREIGN PATENT DOCUMENTS

EP 0 773 702 A2 5/1997

(Continued)

OTHER PUBLICATIONS

Maichael Gayford, "Microphone Engineering Handbook," ISBN 07506 1199 5, pp. 395-396.

(Continued)

*Primary Examiner*—Vivian Chin
*Assistant Examiner*—George C Monikang
(74) *Attorney, Agent, or Firm*—Birch, Stewart, Kolasch & Birch, LLP

(57) ABSTRACT

The present invention relates to a method and a device for processing and reproducing an audio stereo signal. The method produces a left output signal for transmission to a left loudspeaker in a loudspeaker pair, which is, or is equivalent to, the sum of the mid input signal (M) and the side input signal (S), the method further produces a right output signal for transmission to a right loudspeaker in said pair, which is, or is equivalent to, the sum of the mid input signal (M) and the side signal (S) phase shifted 180° . The method further being characterized in that at least part of the side input signal (S) or the mid input signal (M) is phase shifted approximately 45°-135° relative to the other signal prior to or at the production of the left and right output signals. The invention further relates to such an audio stereo signal reproduction system.

25 Claims, 2 Drawing Sheets

U.S. PATENT DOCUMENTS

| | | | | |
|---|---|---|---|---|
| 2,836,662 | A | 5/1958 | Vanderlyn | |
| 2,845,491 | A | 7/1958 | Bertram | |
| 3,241,631 | A | 3/1966 | Manieri | |
| 3,560,656 | A | 2/1971 | Gilbert | |
| 3,892,624 | A | 7/1975 | Shimada | |
| 3,970,787 | A | 7/1976 | Searle | |
| 4,069,394 | A | 1/1978 | Doi et al. | |
| 4,149,036 | A | 4/1979 | Okamoto et al. | |
| 4,349,697 | A | 9/1982 | Skabla | |
| 4,356,349 | A | 10/1982 | Robinson | |
| 4,394,537 | A | 7/1983 | Shima et al. | |
| 4,418,243 | A | 11/1983 | Fixer | |
| 4,572,325 | A | 2/1986 | Schupbach | |
| 4,596,034 | A | 6/1986 | Moncrieff | |
| 4,819,269 | A | 4/1989 | Klayman | |
| 4,837,826 | A | 6/1989 | Schupbach | |
| 5,117,459 | A | 5/1992 | McShane | |
| 5,502,772 | A | 3/1996 | Felder | |
| 5,546,468 | A | 8/1996 | Beard | |
| 5,553,147 | A | 9/1996 | Pineau | |
| 5,579,395 | A | 11/1996 | Horl | |
| 5,579,396 | A | 11/1996 | Iida et al. | |
| 5,596,034 | A | 1/1997 | Krishnan et al. | |
| 5,850,454 | A | 12/1998 | Hawks | |
| 5,870,484 | A | 2/1999 | Greenberger | |
| 5,892,830 | A | 4/1999 | Klayman | |
| 5,896,456 | A * | 4/1999 | Desper | 381/1 |
| 5,970,153 | A | 10/1999 | Petroff | |
| 6,169,812 | B1 | 1/2001 | Miller | |
| 6,590,983 | B1 * | 7/2003 | Kraemer | 381/17 |
| 6,731,765 | B1 | 5/2004 | Sotome | |
| 6,760,447 | B1 * | 7/2004 | Nelson et al. | 381/17 |
| 6,991,289 | B2 | 1/2006 | House | |
| 2004/0170281 | A1 | 9/2004 | Nelson | |
| 2005/0201582 | A1 | 9/2005 | Hughes, II et al. | |
| 2005/0221867 | A1 | 10/2005 | Zurek et al. | |

FOREIGN PATENT DOCUMENTS

| | | | |
|---|---|---|---|
| WO | WO-97/30566 | A1 | 8/1997 |
| WO | WO-98/36614 | A1 | 8/1998 |
| WO | WO-99/33173 | A1 | 7/1999 |
| WO | WO-01/39547 | A1 | 5/2001 |
| WO | WO-01/39548 | A1 | 5/2001 |

OTHER PUBLICATIONS

Timothy M. Bock, Crown International, Inc., Elkhart, Indiana, and D. (Don) B. Keele, Jr., Techron, Division of Crown International, Inc., The Effects of Interaural Crosstalk on Stereo Reproduction and Minimizing Interaural Crosstalk in Nearfield Monitoring by the use of a Physical Barrier; Part 1, Presented at the 81st Convention, 1986, Nov. 12-16, Los Angeles, CA, An Audio Engineering Society Preprint.

John Eargle, "Handbook of Recording Engineering," USBN0-442-0053-9, pp. 258-259.

B.B. Bauer, "Phasor Analysis of Some Stereophonic Phenomena," J. Acous. Soc. Am., vol. 33, No. 11. (Nov. 1961).

* cited by examiner

AUDIO STEREO PROCESSING METHOD, DEVICE AND SYSTEM

FIELD OF THE INVENTION

The present invention relates to a method, a device and a system for processing an audio stereo signal, and in particular the present invention relates to a method, device and system for processing an input audio stereo signal.

BACKGROUND OF THE INVENTION

A large number of methods and systems exist intended for faithful reproduction of the sound experienced by a listener at the recording position. The system coming closest to virtually move the listener to the recording location, i.e. to convey an impression of the true location of the different sound sources of the original event, is the binaural method of recording and the binaural method of reproduction (headphones). This method has as its shortcomings in that the sound is interpreted by ear canals both in the recording stage and in the reproduction stage and in a worst case even by two sets of pinna (outer ears) on its way to the listeners brain where the sound information is to be interpreted. There are solutions that utilize a simplified recording method including a foam ball of head size with the microphone elements on each side of the ball instead of a replica of a head. This is a compromise to gain sound quality but loses the distinction of localization between front and back and the elevation. All other ways than the binaural method to record and reproduce sound is a creation of an imaginary sound image that is truly subjective. This is the case for both the recording stage and the reproduction stage.

As opposed to previously known methods, the object of the reproduction stage should only be to convey the electrical differences to the listener's auditory system with minimal loss or addition of information. The place where the stereo sound image is created is then the recording and/or mixing stage. The stereo image might be made as a truthful, but still subjective, interpretation of the sound experienced by a listener in a venue, or as an illusion of an imaginary event that never have physically occurred or a mixture of the two.

Most reproduction systems of today are based on a pair of widely spaced loudspeakers, and true reproduction of the electrical stereo signal, both in terms of relative intensity between the sound waves perceived by the ears of the listener and the time difference between these, can at best be perceived only at one single position in relation to the loudspeakers. These methods are often subject to incorrect translation of the electrical stereo information dependant on the preferences of the separate loudspeakers and how the loudspeakers are positioned in relation to the listener. There is thus a need for a sound reproduction system that provides identical reproduction of the stereo sound image regardless of setup and quality of the loudspeakers.

A system that solves this problem is described in the patent application WO01/39548, assigned to the applicant of the present invention, which discloses a method of processing and reproducing an input audio stereo signal. A side signal is split into a first and a second intermediate signal, where the first intermediate signal is equal to the side signal and the second intermediate signal is equal to the first intermediate signal phase shifted 180°, a mid signal is attenuated by a factor $\alpha$ which compensates for imperfections in the balance between the mid and side signals appearing in the audio reproduction stage, the attenuated mid signal is added to both the first and the second intermediate signals, so as to form the output audio stereo signal, and the output stereo signal is directed to an audio stereo signal reproduction system comprising a pair of loudspeaker units located in close proximity to each other. The system described in WO01/39548 allows an audio stereo signal to be reproduced with a high degree of fidelity with high consistency in the perceived stereo image regardless of the quality of system.

A problem with such a system with closely located loudspeaker units, however, is that at high frequencies, above 1-5 kHz, the degree of fidelity in perceived stereo effect degrades or vanishes totally.

SUMMARY OF THE INVENTION

It is an object of the present invention to provide a method for processing an audio stereo signal, which solves the above mentioned problem.

Another object of the present invention is to provide a device for processing an audio stereo signal, which solves the above mentioned problem.

Another object of the present invention is to provide a system for processing an audio stereo signal, which solves the above mentioned problem.

According to the present invention, a left output signal for transmission to a left loudspeaker in a loudspeaker pair is produced, which signal is, or is equivalent to, the sum of a mid input signal M and a side input signal S, at least part of which side signal S or mid signal M being phase shifted approximately 45°-135° with respect to the other signal, and a right output signal for transmission to a right loudspeaker in said pair is produced, which signal is, or is equivalent to, the sum of the mid input signal M, and a 180° phase shifted side signal S, at least part of which side signal S or mid signal M being phase shifted approximately 45°-135° with respect to the other signal.

This has the advantage that the phase difference that the present invention introduces into the stereo signal translates incoming level difference into phase difference between the stereo channels. This phase difference will be translated into a level difference when the stereo signal is played back through a loudspeaker pair. Level difference, in contrast to phase difference, is a strong localization cue for shorter wavelengths, and consequently the phase shift introduced by the present invention will improve the degree of fidelity in perceived stereo effect considerably.

The mid input signal M may be attenuated by a factor $\alpha$ and/or the side input signal S may be amplified a factor $\beta$ in the production of the left output signal and the right output signal. This has the advantage that a stereo audio signal composed of level difference for long wavelengths and phase difference for short wavelengths may be obtained, which signal will be played back through a loudspeaker pair as phase difference for low frequencies, which is a strong localization cue for low frequencies, and level difference for high frequencies, which, as mentioned above, is a strong localization cue for high frequencies.

The input signals in the present invention may be a left input signal L and a right input signal R, in which case the mid input signal M is produced as the sum of the left input signal L and the right input signal R, and the side input signal is produced as the difference of the left input signal L and the right input signal R. This has the advantage that a conventional stereo signal may be used as input signals in the present invention.

The loudspeaker elements may be closely located, and in particular the pair of loudspeaker elements may consist of a pair of identical loudspeaker elements being acoustically isolated from each other, and located within less than one quarter of the shortest wavelength emitted by the elements, or, if the shortest wavelength emitted by the elements is less than 68 cm, less than 17 cm. This has the advantage that the present invention is very well suited for use in a method and system as described in WO01/39548.

The phase shift may be accomplished such that all of the side input signal S or the mid input signal M is phase shifted 45°-135°, preferably 90°. This may advantageously be accomplished by digital signal processing, e.g. by a Hilbert transform. Alternatively, the phase shift may be accomplished by a frequency dependent filter, such as an analogue all-pass filter. This has the advantage that a less expensive solution may be obtained for cost sensitive applications and/or applications where the processing time is critical. The mid input signal M may be delayed a time corresponding to the delay of the phase shifting means. This may facilitate the obtaining of a desired phase relation between the side input signal S and the mid input signal M.

DESCRIPTION OF A PREFERRED EMBODIMENT

Figure 1:
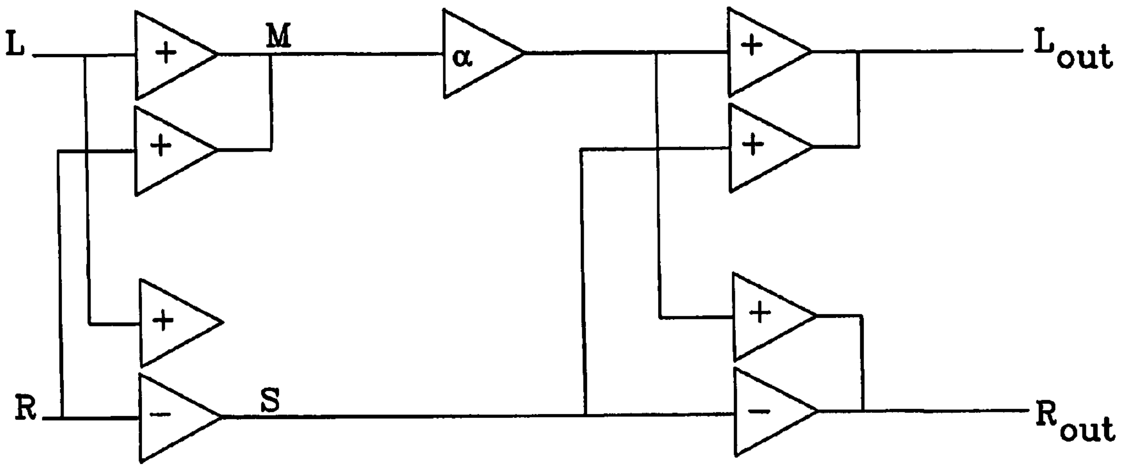
FIG. 1 is a block diagram illustrating a prior art system for processing stereo signals.

FIG. 1 illustrates the functional principle for a prior art device for processing an audio stereo signal. The input audio stereo signal comprises a left input stereo signal L and a right input stereo signal R. The L and R signals are used to obtain a mid signal M, and a side signal S, corresponding to the sum of the left L and right R input stereo signals, and the difference between the left L and right R input stereo signals, respectively. The output stereo signal $L_{OUT}$, which is to be sent to a left sound reproducing unit, such as a loudspeaker, is the sum of the side signal, S, and the mid signal M multiplied by an attenuating factor α, while the output stereo signal $R_{OUT}$, which is to be sent to a right sound reproducing unit is the sum of the inverted side signal, S, and the mid signal M multiplied by an attenuating factor α.

The system described in FIG. 1 allows an electrical audio stereo signal to be reproduced with a high degree of fidelity with high consistency in the perceived stereo image regardless of the quality of system. As stated above, however, the system in FIG. 1 suffers from the problem that the degree of fidelity in perceived stereo effect degrades or vanishes totally at frequencies above 1-5 kHz.

This is due to the fact that level difference in $L_{OUT}$ and $R_{OUT}$ resulting from the respective addition and subtraction of the S signal is transformed into phase difference when played back through the loudspeaker elements. This phase difference is a strong localization cue for low frequencies, and results in excellent stereo resolution for these lower frequencies. Due to the characteristics of the human ear, however, the ability to detect phase differences between two signals received by the left and the right ear, respectively, vanishes at high frequencies. The reason for this is the phase locking of the auditory nerve that tend to fire at a particular phase of a stimulating low frequency tone (<4-5 kHz), with one burst of spikes per cycle for frequencies below about 1000 Hz. Interspike intervals tend to occur at integer multiples of the period of the tone. With high frequency tones (>4-5 kHz) phase locking gets weaker and then disappear, because the capacitance of inner hair cells prevents them from changing in voltage sufficiently rapidly. The lack of phase locking above 4-5 kHz affirms that the system in FIG. 1 conveys week localization cues for sounds containing only short wavelengths with only level difference between the stereo channels.

Figure 2:
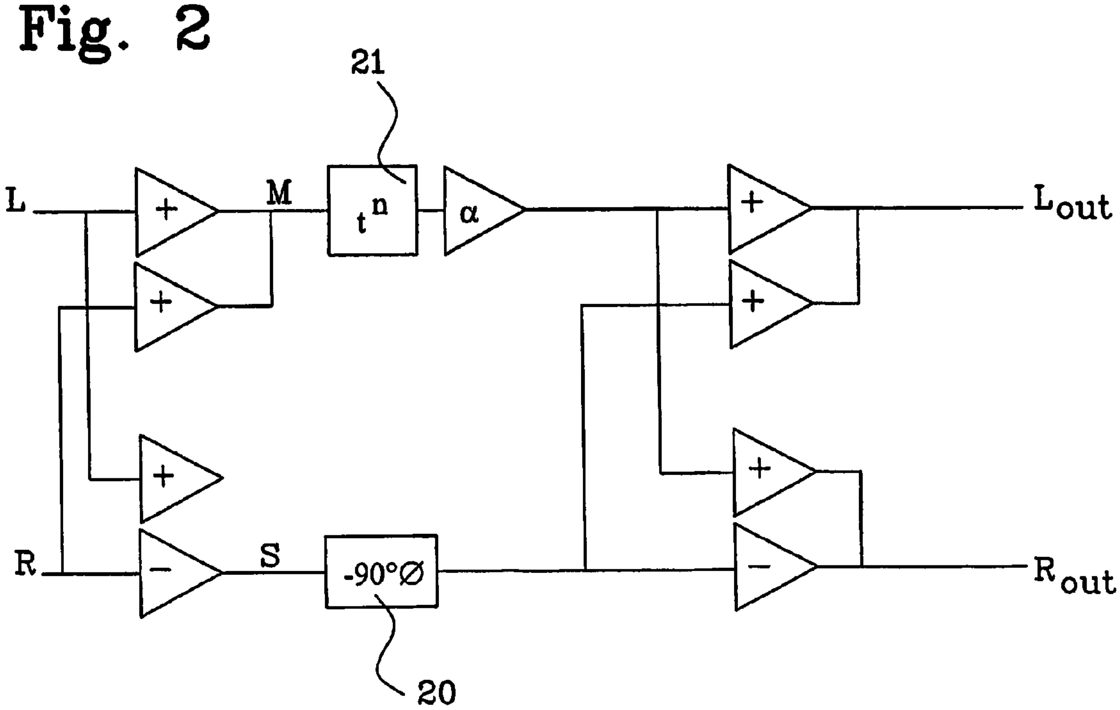
FIG. 2 is a block diagram illustrating a first embodiment of the present invention.

The present invention seeks to solve the above problem with a device as illustrated in FIG. 2. The device in FIG. 2 is similar to the device in FIG. 1 with the difference that in FIG. 2 an extra unit 20 has been added. As in FIG. 1, a mid signal M is obtained by summing the left L and right R input stereo signals, and a side signal S is obtained by subtracting the right input stereo signal R from the left input stereo signal L. The side signal S is then phase shifted −90° prior to the creation of the output stereo signals $L_{OUT}$, and $R_{OUT}$. The output stereo signal $L_{OUT}$ is then obtained by taking the sum of the phase shifted side signal S and the mid signal M multiplied by an attenuating factor α, while the output stereo signal $R_{OUT}$ is obtained by subtracting the phase shifted side signal S from the mid signal M multiplied by an attenuating factor α. This is equal to taking the sum of an inverted phase shifted side signal S and the mid signal M multiplied by an attenuating factor α. Inverting the side signal is equivalent to negating it or phase shifting it 180°.

The attenuation factor α would typically be −6 dB to −12 dB. In a general case, however, the attenuation factor α is adapted to optimise the stereo effect perceived by the listener, and is allowed to vary in an interval from −3 dB to −15 dB.

The phase shift may be accomplished by a digital signal processor, e.g. by a Hilbert transform. Digital signal processing has the advantage that a true 90° phase shift can be performed for all wavelengths and may be obtained with little or no amplitude change over frequency (use of analogue circuits may result in a phase drift in the audible spectra in the range of 500-700° or more, however with a relative phase difference of 90° between the mid signal M and the side signal S). This type of phase shifting is particularly suitable for systems in which digital signal processing means already are present, and where the applications are not time critical. Further, it may be desirable to include a delay circuit in the device, shown as 21 in FIG. 2, to delay the mid input signal M with a time corresponding to the processing time of the phase shifting means. This facilitates maintaining of the desired phase relation between the side input signal S and the mid input signal M.

Figure 3:
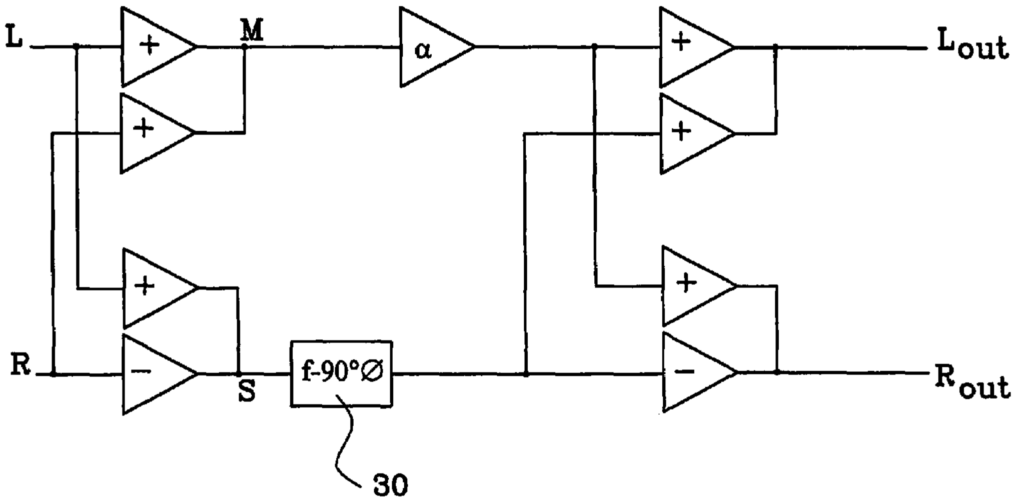
FIG. 3 is a block diagram illustrating a second embodiment of the present invention.
Figure 4:
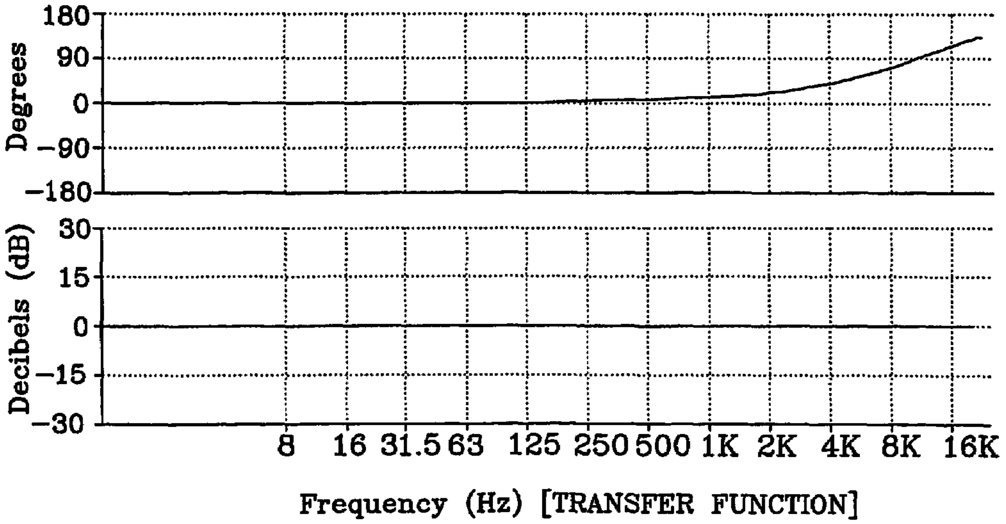
FIG. 4 shows an example of the frequency response of an all pass filter in the embodiment shown in FIG. 3.

FIG. 3 illustrates a second embodiment of the present invention. The second embodiment of the present invention is a solution for applications where the phase shift is desired but the application is cost sensitive and/or where the processing time is critical, such as in professional recording studios. In the second embodiment, the mid signal M and side signal S is obtained as in FIG. 2, and the side signal is then S altered by a unit 30 including a frequency dependent analogue all pass filter with its centre frequency set well above the shortest audible wavelength. This means that the phase shift is starting with only a few degrees at e.g. 500 Hz to reach +90° at e.g. 10 kHz. The phase response of the all pass filter is thus tailored to gradually translate the phase difference of the output stereo signal into level difference as the phase locking gets weaker for higher frequencies. As the phase response of an analogue filter rarely can be of negative nature the unit 30 further includes means to invert the signal to get the desired result of a phase shift of −90°. The phase shift should preferably be negative since otherwise the original L and R signals might be switched. An example of a phase response for the all pass filter is shown in FIG. 4. As can be seen in the figure, the phase shift starts from substantially 0° at low frequencies to reach 90° at high frequencies (e.g. 10 kHz). It is also possible to create the frequency dependent phase shift with the aid of digital signal processing, however with the extra cost this might incur.

The factor α in FIG. 3 can be made frequency dependant so that the factor is different for separate drivers of, for example, different elements in a multi-way loudspeaker configuration.

The mid signal M is then added to the phase shifted side signal S to form a first output signal, and the phase shifted side signal S is then subtracted from the mid signal M to form the second output signal.

Generally, the method described in the present application could equivalently be used for any input terms which can be described as a linear transformation of the R and L signals or the M and S signals, but as a matter of convenience, the method has been exemplified using the M and S, and the R and L pictures, respectively. The method should therefore be interpreted as a method having an output, which is equivalent to $S_{ps}+\alpha M$ and $-S_{ps}+\alpha M$, where $S_{ps}$ is the S signal phase shifted with 90°. As has been described, the M and S signals may be produced during an intermediate step in the process, but this does not have to be the case as long as the resulting output condition is fulfilled.

In the above description the phase shift has been described as 90°. This phase shift may however be any phase shift in an interval between 45°-135°. Further, in the above description the phase shift has been performed on the side signal S. It may however as well be performed on the mid signal M. Further, in the above description the analogue all pass filter could however be exchanged by a digital filter doing an identical filtering function as the above described analogue all pass filter. In this case, it may be desirable to include a delay circuit in the device, as shown as 21 in FIG. 2, to delay the mid input signal M with a time corresponding to the processing time of the phase shifting means also in this embodiment.

Further, in the above description the input stereo signals consist of a L and a R signal. The input signals could however as well consist of the M and S signals, in which case the first addition and subtraction steps are omitted.

Further, in the above description the mid signal M has been attenuated a factor α. It is, however, of course possible to amplify the side signal S with a factor β instead.

In the detailed description of the present invention the phase shift has been carried out on the side input signal S. The phase shift could however as well be carried out on the mid input signal M.

Inasmuch as the present invention is subject to variations, modifications and changes in detail, some of which have been stated herein, it is intended that all matter described throughout this entire specification or shown in the accompanying drawings be interpreted as illustrative and not in a limiting sense.

The invention claimed is:

1. A method of processing an input audio stereo signal comprising two input signals, for reproduction of a processed stereo signal in an audio stereo reproduction system comprising at least one pair of loudspeaker elements, the method comprising the steps of:

a) providing a mid input signal (M) and a side input signal (S), b) producing a left output signal for transmission to a left loudspeaker in said pair, which is, or is equivalent to, the sum of the mid input signal (M) and the side input signal (S), the mid input signal (M) being attenuated by a factor α and/or the side input signal (S) being amplified a factor β, the factor α and/or β corresponding to an attenuation factor α in the range −3 dB to −15 dB;

c) producing a right output signal for transmission to a right loudspeaker in said pair, which is, or is equivalent to, the sum of the mid input signal (M) and the side signal (S) phase shifted 180°, the mid input signal (M) being attenuated by a factor α and/or the side input signal (S) being amplified a factor β, the factor α and/or β corresponding to an attenuation factor α in the range −3 dB to −15 dB;

the method further including the step of:

at least a part of the side input signal (S) or the mid input signal (M) in the frequency range 4 kHz-9 kHz is phase shifted at least 45° but no more than 135° relative to the other signal prior to or at the production of the left and right output signals in steps b) and c).

2. The method according to claim 1, wherein at least the part of the mid input signal (M) or the side input signal (S) in the frequency range 6 kHz-9 kHz is phase shifted at least 45° but no more than 135° with respect to the other signal.

3. The method according to claim 1, wherein:

in step a) the mid input signal (M) is obtained as the sum of a left input signal (L) and a right input signal (R), and in step a) the side input signal (S) is obtained as the difference of the left input signal (L) and the right input signal (R).

4. The method according to claim 1, wherein the attenuation factor α is in the range −6 dB to −12 dB.

5. The method according to claim 1, wherein the attenuation factor α and/or the amplification factor β is frequency dependent.

6. The method according to claim 1, wherein the loudspeaker elements are closely located.

7. The method according to claim 1, wherein the pair of loudspeaker elements consists of a pair of identical loudspeaker elements being acoustically isolated from each other, and located within less than one quarter of the shortest wavelength emitted by the elements, or, if the shortest wavelength emitted by the elements is less than 68 cm, less than 17 cm.

8. The method according to claim 1, wherein substantially all of the side input signal (S) or the mid input signal (M) is phase shifted approximately 90°.

9. The method according to claim 1, wherein the phase shift is accomplished by a frequency dependent filter which is an all pass filter.

10. The method according to claim 1, wherein the phase shift is accomplished by digital signal processing by a Hilbert transform.

11. The method according to claim 1, wherein the mid input signal (M) is delayed with a time corresponding to the delay of the phase shifting means.

12. A device for processing an input audio stereo signal comprising two input signals, for reproduction of a processed stereo signal in an audio stereo reproduction system comprising at least one pair of loudspeaker elements, the device comprising:

a) means for producing a left output signal for transmission to a left loudspeaker in said pair, which is, or is equivalent to, the sum of the mid input signal (M) and the side input signal (S), the mid input signal (M) being attenuated by a factor α and/or the side input signal (S) being amplified a factor β, the factor α and/or β corresponding to an attenuation factor α in the range −3 dB to −15 dB b) means for producing a right output signal for transmission to a right loudspeaker in said pair, which is, or is equivalent to, the sum of the mid input signal (M) and the side signal (S) phase shifted 180°, the mid input signal (M) being attenuated by a factor α and/or the side input signal (S) being amplified a factor β, the factor α and/or β corresponding to an attenuation factor α in the range −3 dB to −15 dB;

wherein the device further comprises:

c) means for phase shifting at least a part of the side input signal (S) or the mid input signal (M) in the frequency range 4 kHz-9 kHz at least 45° but no more than 135° relative to the other signal prior to or at the production of the left and right output signals in steps a) and b).

13. The device according to claim 12, further comprising means for phase shifting at least the part of the mid input signal (M) or the side input signal (S) in the frequency range 6 kHz-9 kHz at least 45° but no more than 135° with respect to the other signal.

14. The device according to claim 12, wherein the device further comprises means for providing a side input signal (S) and a mid input signal (M), and that the device is arranged to provide the mid input signal (M) as the sum of a left input signal (L) and a right input signal (R), and the side input signal (S) as the difference of the left input signal (L) and the right input signal (R).

15. The device according to claim 12, wherein the attenuation factor α is in the range −6 dB to −12 dB.

16. The device according to claim 12, wherein the attenuation factor α and/or the amplification factor β is frequency dependent.

17. The device according to claim 12, wherein the loudspeaker elements are closely located.

18. The device according to claim 12, wherein the pair of loudspeaker elements consists of a pair of identical loudspeaker elements being acoustically isolated from each other, and located within less than one quarter of the shortest wavelength emitted by the elements, or, if the shortest wavelength emitted by the elements is less than 68 cm, less than 17 cm.

19. The device according to claim 12, wherein substantially all of the side input signal (S) or the mid input signal (M) is phase shifted approximately 90°.

20. The device according to claim 12, wherein the phase shift is accomplished by a frequency dependent filter which is an all pass filter.

21. The device according to claim 12, wherein the phase shift is accomplished by digital signal processing means by a Hilbert transform.

22. The device according to claim 12, wherein the attenuation factor α and/or the amplification factor β is frequency dependent, wherein the phase shift is accomplished by a frequency dependent filter which is an all pass filter, and wherein the mid input signal (M) is delayed with a time corresponding to the delay of the phase shifting means.

23. A system, for reproduction of an input audio stereo signal comprising two input signals consisting of a mid input signal (M) and a side input signal (S), or of a kind from which a mid input signal (M) and a side input signal (S) are derivable, such as a left input signal (L) and a right input signal (R), comprising a pair of loudspeaker elements, the system further comprising:

a) means for producing a left output signal for transmission to a left loudspeaker in said pair, which is, or is equivalent to, the sum of the mid input signal (M) and the side input signal (S), the mid input signal (M) being attenuated by a factor α and/or the side input signal (S) being amplified a factor β, the factor α and/or β corresponding to an attenuation factor α in the range −3 dB to −15 dB;

b) means for producing a right output signal for transmission to a right loudspeaker in said pair, which is, or is equivalent to, the sum of the mid input signal (M) and the side signal (S) phase shifted 180°, the mid input signal (M) being attenuated by a factor α and/or the side input signal (S) being amplified a factor β, the factor α and/or β corresponding to an attenuation factor α in the range −3 dB to −15 dB;

wherein the system further comprises:

c) means for phase shifting at least a part of the side input signal (S) or the mid input signal (M) in the frequency range 4 kHz-9 kHz at least 45° but no more than 135° relative to the other signal prior to or at the production of the left and right output signals in steps a) and b).

24. The system according to claim 23, wherein the system further comprises means for phase shifting at least the part of the mid input signal (M) or the side input signal (S) in the frequency range 6 kHz-9 kHz at least 45° but no more than 135° with respect to the other signal.

25. The system according to claim 23, wherein the pair of loudspeaker elements consists of a pair of identical loudspeaker elements being acoustically isolated from each other, and located within less than one quarter of the shortest wavelength emitted by the elements, or, if the shortest wavelength emitted by the elements is less than 68 cm, less than 17 cm.

* * * * *